(12) United States Patent
Nandakumar

(10) Patent No.: US 6,882,013 B2
(45) Date of Patent: Apr. 19, 2005

(54) TRANSISTOR WITH REDUCED SHORT CHANNEL EFFECTS AND METHOD

(75) Inventor: Mahalingam Nandakumar, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/355,675

(22) Filed: Jan. 30, 2003

(65) Prior Publication Data

US 2003/0141550 A1 Jul. 31, 2003

Related U.S. Application Data

(60) Provisional application No. 60/353,398, filed on Jan. 31, 2002.

(51) Int. Cl.⁷ .............................................. H01L 29/76
(52) U.S. Cl. ....................... 257/368; 257/344; 257/347; 257/348; 257/336; 257/408
(58) Field of Search ................................ 257/336, 344, 257/345, 347, 348, 368, 369, 370, 408; 438/199, 202, 205, 275, 289, 309, 300, 301, 302, 303, 304, 305

(56) References Cited

U.S. PATENT DOCUMENTS

| | | | | |
|---|---|---|---|---|
| 5,023,190 A | * | 6/1991 | Lee et al. ................... 438/200 |
| 5,091,763 A | * | 2/1992 | Sanchez ..................... 257/344 |
| 5,278,441 A | * | 1/1994 | Kang et al. ................. 257/371 |
| 5,291,052 A | * | 3/1994 | Kim et al. ................... 257/369 |
| 5,668,024 A | * | 9/1997 | Tsai et al. ................... 438/199 |
| 5,747,373 A | * | 5/1998 | Yu ............................. 438/305 |
| 5,759,901 A | * | 6/1998 | Loh et al. ................... 438/305 |
| 5,827,747 A | * | 10/1998 | Wang et al. ................ 438/199 |
| 5,851,866 A | * | 12/1998 | Son ............................. 438/231 |
| 5,917,219 A | | 6/1999 | Nandakumar et al. ...... 257/348 |
| 5,976,937 A | | 11/1999 | Rodder et al. ............. 438/275 |
| 6,078,079 A | * | 6/2000 | Ogoh ......................... 257/344 |
| 6,093,610 A | | 7/2000 | Rodder ...................... 438/289 |
| 6,107,149 A | * | 8/2000 | Wu et al. ................... 438/303 |
| 6,238,960 B1 | * | 5/2001 | Maszara et al. ............ 438/197 |
| 6,274,906 B1 | * | 8/2001 | Kim et al. .................. 257/336 |
| 6,512,273 B1 | * | 1/2003 | Krivokapic et al. ........ 257/369 |
| 6,548,877 B1 | * | 4/2003 | Yang et al. ................. 257/382 |
| 2002/0043689 A1 | * | 4/2002 | Matsuoka et al. .......... 257/368 |

* cited by examiner

Primary Examiner—Eddie Lee
Assistant Examiner—Quang Vu
(74) Attorney, Agent, or Firm—Yingsheng Tung; Wade James Brady, III; Frederick J. Telecky, Jr.

(57) ABSTRACT

A method of fabricating a transistor (10) comprises forming source and drain regions (46) and (47) using a first sidewall (42) and (43) as a mask and forming a deep blanket source and drain regions (54) and (56) using a second sidewall (50) and (51) as a mask, the second sidewall (50) and (51) comprising at least part of the first sidewall (42) and (43).

10 Claims, 4 Drawing Sheets

US 6,882,013 B2

TRANSISTOR WITH REDUCED SHORT CHANNEL EFFECTS AND METHOD

This application claims priority under 35 USC 119(e)(1) of provisional application Ser. No. 60/353,398, filed Jan. 31, 2002.

TECHNICAL FIELD OF THE INVENTION

This invention relates generally to the field of integrated circuits, and more particularly to a transistor with reduced short channel effects, and a method for making same.

BACKGROUND OF THE INVENTION

Modern electronic equipment such as televisions, telephones, radios and computers are generally constructed of solid state devices. Solid state devices are preferred in electronic equipment because they are extremely small and relatively inexpensive. Additionally, solid state devices are very reliable because they have no moving parts, but are based on the movement of charge carriers.

Solid state devices may be transistors, capacitors, resistors, and other semiconductor devices. Typically, such devices are formed in and on a substrate and are interconnected to form an integrated circuit. One type of transistor is the metal oxide semiconductor field effect transistor (MOSFET) in which current flows through a narrow conductive channel between a source and drain and is modulated by an electric field applied at the gate electrode.

The size of MOSFETs continues to be reduced to accommodate an even larger number of devices in an integrated circuit and to increase the power and capabilities of the circuit. This reduction in size leads to short channel effects that degrade device performance. Solutions such as enlarging the sidewall insulator formed along the gate electrode to space the source and drain apart from the conductive channel underlying the gate electrode have reduced short channel effects at the cost of otherwise degrading device performance. However, current semiconductor fabrication methods have not adequately reduced or eliminated these short-channel effects. In addition, degraded conductivity and leakage problems persist.

SUMMARY OF THE INVENTION

The present invention provides a transistor with reduced short channel effects that substantially eliminates or reduces the disadvantages and problems associated with prior systems and methods.

In accordance with one embodiment of the present invention, a method of fabricating a transistor comprises forming source and drain regions using a first sidewall as a mask and forming a deep blanket source and drain regions using a second sidewall as a mask, the second sidewall comprising at least part of the first sidewall.

Technical advantages of the present invention include providing, in one embodiment, an improved transistor with reduced source-drain resistance without degrading short-channel effects and without any additional photo masking steps. In a particular embodiment, short channel effects are minimized while maintaining a transistor size of less than 0.1 μm.

Another technical advantage of the present invention is improved method for fabricating MOSFET and other transistors and devices.

Certain embodiments may possess none, one, some, or all of these technical features and advantages and/or additional technical features and advantages.

Other technical advantages will be readily apparent to one skilled in the art from the following figures, description, and claims.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE INVENTION

FIGS. 1A–G are a series of schematic cross-sectional diagrams illustrating fabrication of a transistor with source/drain regions and blanket compensation implants in accordance with one embodiment of the present invention. In this embodiment, the transistor may be one of a complementary set of metal oxide semiconductor field effect transistors (MOSFETs) of a sub-micron regime. It will be understood that the type and size of the transistor may be varied within the scope of the present invention.

Figure 1A:
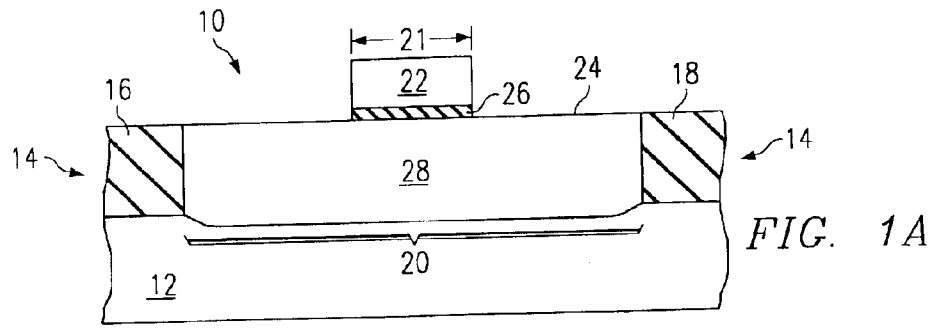
FIGS. 1A–G are a series of schematic cross-sectional diagrams illustrating fabrication of a transistor with source/drain regions and blanket compensation implants in accordance with one embodiment of the present invention.

Referring to FIG. 1A, an initial semiconductor structure 10 may comprise a semiconductor layer 12. The semiconductor layer 12 may be a substrate such as a wafer. In this embodiment, the semiconductor layer 12 may comprise a single-crystalline silicon material. It will be understood that the semiconductor layer 12 may also be a layer of semiconductor material formed on a substrate, a semiconductor on insulator (SOI) layer and the like. For example, the semiconductor layer 12 may be an epitaxial layer grown on a wafer.

A first isolation member 16 and a second isolation member 18 may be shallow trenches that are filled with oxide/insulator in the semiconductor layer 12. The isolation members 16 and 18 may be independent structures or part of a unitary structure. For sub-micron applications, the isolation members 16 and 18 may comprise shallow isolation trenches. It will be understood that other types of isolation members and/or structures may be used within the scope of the present invention. For example, the isolation members 16 and 18 may comprise a field oxide.

The isolation members 16 and 18 may define an active area 20 in the semiconductor layer 12. As described in more detail below, source, drain and channel regions and/or structures, may be defined in the active area 20. A gate electrode may control the flow of current from the source region to the drain region through the channel region to operate the transistor. It will be understood that the active area 20 may comprise other suitable regions and structures.

A gate electrode 22 may be disposed over and insulated from the active area 20. The gate electrode may have a width 21 of about 100 to 1200 angstroms. In one embodiment, the gate electrode 22 may be separated from an outer surface 24 of the active area 20 by a gate insulator 26. In this embodiment, the gate electrode 22 may comprise polycrystalline silicon, silicon germanium, or other suitable semiconductor material. The gate insulator 26 may comprise silicon dioxide, nitrided silicon dioxide, or other suitable insulating material. It will be understood that the gate electrode 22 may be otherwise suitably operationally associated with regions and structures in the active area 20.

In accordance with one embodiment of the present invention, a transistor may have a gate 22 with a length of 100 angstroms with an active area 20 extending an additional 1,000–10,000 angstroms.

In a particular embodiment, the transistor may comprise an n-MOS transistor. In this embodiment, the active area 20 may comprise a p-well 28 formed in the semiconductor layer 12. The p-well 28 may comprise the single-crystalline silicon material of the semiconductor layer 12 slightly doped with the p-type dopant such as boron. It will be understood that the semiconductor layer 12 may comprise other materials, may be suitably otherwise doped within the scope of the present invention, and that the p-well 28 may be omitted. For example, the semiconductor layer 12 may itself be slightly doped eliminating the need for the well 28. In another embodiment, the transistor may comprise a p-MOS transistor, in which case the semiconductor layer 12 may be doped with an n-type dopant such as arsenic and/or phosphorus.

Figure 1B:
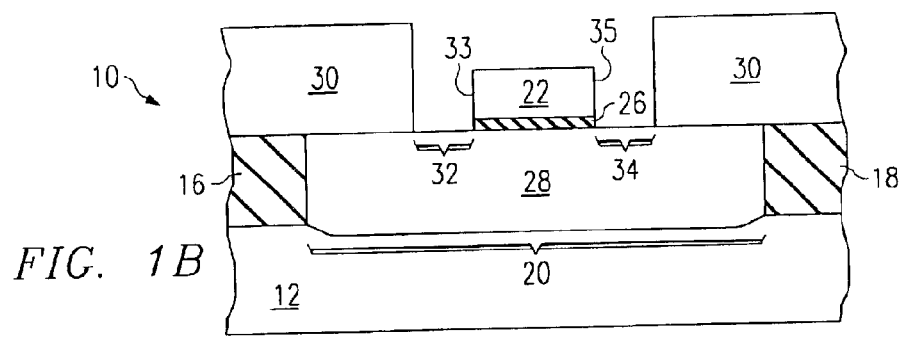

Referring to FIG. 1B, a masking layer 30 may be formed outwardly the semiconductor layer 12 and expose a first section 32 and a second section 34 of the active area 20. In one embodiment, the exposed first section 32 may be proximate to a first side 33 of the gate electrode 22 facing the first isolation member 16. The exposed second section 34 may be proximate to a second side 34 of the gate electrode 22 facing the second isolation member 18. It will be understood that the sections 32 and 34 exposed by the masking layer 30 may be suitably varied within the scope of the present invention.

The masking layer 30 may comprise photoresist material. In this embodiment, the masking layer 30 may be conventionally coated, patterned and etched to expose the first and second sections 32 and 34 of the active area 20. It will be understood that the masking layer 30 may comprise other suitable materials and/or be otherwise suitably formed within the scope of the present invention.

Figure 1C:
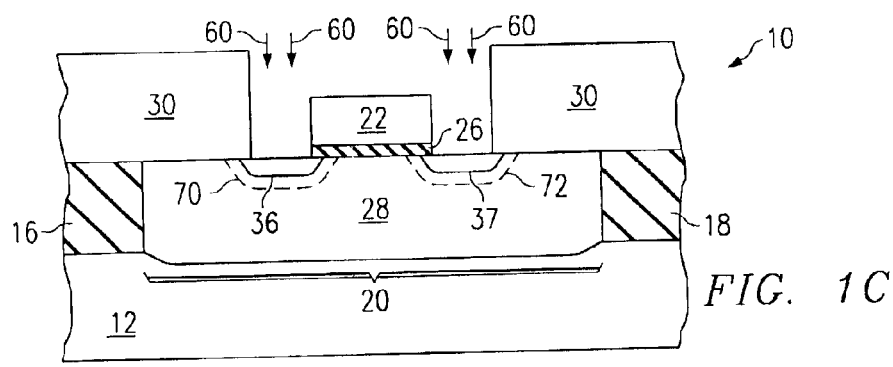

Referring to FIG. 1C, dopants 60 are implanted into the exposed first section 32 to form at least part of a source region and into the exposed second section 34 to form at least part of a drain region. In one embodiment in which the transistor is an n-MOS transistor, dopants 60 may comprise arsenic conventionally doped at an energy of about 1 to 10 keV to a dose of about 2E14–2E15 atoms/cm$^2$. In another embodiment in which the transistor is a p-MOS transistor, dopants 60 may comprise BF$_2$ conventionally doped at an energy of about 1 to 10 keV to a dose of about 1E14 atoms/cm$^2$–2E15 atoms/cm$^2$.

In one embodiment, the doped exposed first section 32 may comprise a source extension 36. The doped exposed second section 34 may comprise a drain extension 37. It will be understood that the exposed first and second sections 32 and 34 of the active area 20 may comprise other suitable elements of the source and drain regions.

In one embodiment, the source extension 36 may be localized in that it may be spaced apart from the first isolation member 16 and thus does not extend the distance between the gate electrode 22 and the first isolation member 16; however, in other embodiments this localization is not utilized. Similarly, the drain extension 37 is localized in that it is spaced apart from the second isolation member 18 and thus does not extend the full distance between the gate electrode 22 and the second isolation member 18. Accordingly, the localized source and drain extensions 36 and 37 may reduce junction capacitance and diode leakage.

The source and drain extensions 36 and 37 may each vertically overlap the gate electrode 22 by approximately 100–600 angstroms. The extent of overlap is determined by implant depth and/or thermal treatment or other migration of the implanted dopants. It will be understood that the localized source and drain extensions 36 and 37 may be otherwise disposed with respect to the gate electrode 22.

Pocket/halo dopants may be implanted into the exposed sections 32 and 34 inwardly of the extensions 36 and 37 to form a source pocket 70 and a drain pocket 72. The pockets 70 and 72 may be used in connection with the extensions 36 and 37 to reduce gate length sensitivity of drive current and leakage. In one embodiment, the pocket dopants may be the dopants of the opposite type used to form the extensions 36 and 37, but may be implanted in the semiconductor layer 12 at a higher energy. It will be understood that the pockets 70 and 72 may comprise dopants otherwise introduced within the scope of the present invention. For example, the pocket dopants may be implanted at the same or other energy.

For the embodiment where the transistor shown in FIGS. 1A–1G is an n-MOS transistor, the localized source and drain extensions 36 and 37 may each comprise n-type dopants such as arsenic implanted at an energy of about 3–10 keV and a dose of about 1E14 to 1E16 atoms/cm2. In this embodiment, the localized source and drain pockets 70 and 72 may comprise p-type dopants such as boron or indium implanted at an energy of about 5–30 keV or 50–200 keV, respectively, and a dose of about 1E13 to 5E14 atoms/cm$^2$. It will be understood that the localized source and drain extensions 36 and 37 and pockets 70 and 72 may be otherwise doped within the scope of the present invention. In another embodiment, the transistor may comprise a p-MOS transistor, in which case the localized source and drain extensions 36 and 37 may each comprise p-type dopants such as boron or BF$_2$ implanted at an energy of about 0.1 to 10 keV and a dose of about 1E14 to 5E15 atoms/cm$^2$ and the localized source and drain pockets 70 and 72 may comprise n-type dopants such as phosphorus or arsenic implanted at an energy of about 10 to 60 keV (phosphorus) or about 50 to 200 keV (arsenic) and a dose of about 1E13 to 5E14 atoms/cm$^2$.

After the localized source and drain extensions 36 and 37 and pockets 70 and 72 have been formed, the masking layer 30 may be conventionally removed.

Figure 1D:
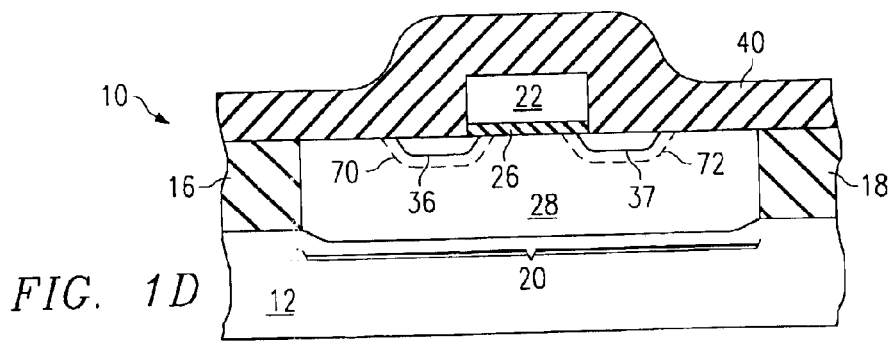

Referring to FIG. 1D, an insulating layer 40 is deposited outwardly of the semiconductor layer 12 and the gate electrode 22. In one embodiment, the insulating layer 40 may be deposited directly onto the semiconductor layer 12 and the gate electrode 22. In this embodiment, the insulating layer 40 may comprise an oxide and/or nitride layer. It will be understood that the insulating layer 40 may comprise other materials capable of insulating semiconductor elements.

Figure 1E:
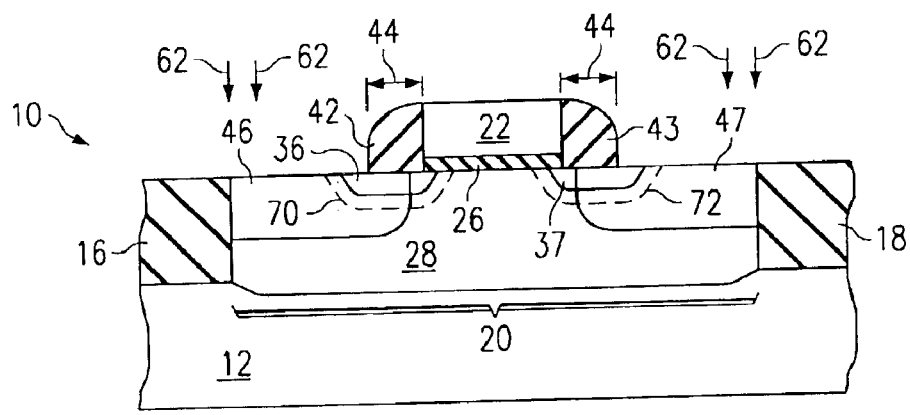

Referring to FIG. 1E, the insulating layer 40 is anisotropically etched to form a first sidewall 42 adjacent the first side 33 of the gate electrode 22 and a second sidewall 43 adjacent the second side 34 of the gate electrode 22. The anisotropic etch may be a conventional reactive ion etch (RIE) or other suitable etch. The sidewalls 42 and 43 may electrically isolate sides 33 and 34 of the gate electrode 22 from other elements of the transistor. The sidewalls 42 and 43 in this embodiment have a width 44 of approximately 200 to 1000 angstroms.

Dopants 62 are implanted into the exposed portions of the active area 20 between the first sidewall 42 and isolation member 16 to form a source main body 46 and between the second sidewall 43 and isolation member 18 to form a drain main body 47. For the embodiment where the transistor shown in FIGS. 1A–1G is an n-MOS transistor, the dopants 62 may comprise n-type dopants such as arsenic. For an n-MOS transistor, the dopants 62 may be implanted to a dose of about 5E14 to 3E15 atoms/cm$^2$, at an energy of about 20 to 80 keV. In another embodiment where the transistor shown in FIGS. 1A–1G is a p-MOS transistor, the dopants 62 may comprise p-type dopants such as boron. For a p-MOS transistor, the dopants 62 may be implanted to a dose of about 5E14 to 3E15 atoms/cm$^2$, at an energy of about 1 to 10 keV. In this way, source-drain resistance may be lowered by implanting, with a mask, dopants 62 to form relatively high dose source/drain main bodies 46 and 47.

In the illustrated embodiment wherein the transistor shown in FIGS. 1A–1G is an n-MOS transistor and if transistor elements of both n-MOS and p-MOS types are present in the same circuit (a CMOS circuit), the pMOS type transistor element may be masked or otherwise covered during implantation of the dopants 62 in an n-MOS transistor element. Likewise, in another embodiment where the transistor shown in FIGS. 1A–1G is a p-MOS transistor and both types of elements are present in the same circuit, the n-MOS type transistor element may be masked or otherwise covered during implantation of the dopants 62 in a p-MOS transistor element.

Figure 1F:
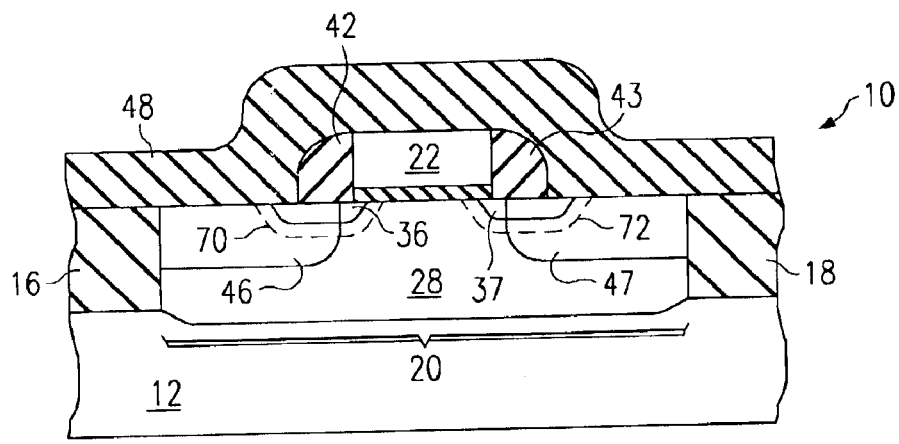

Referring to FIG. 1F, an additional insulating layer 48 may be deposited outwardly of and on the semiconductor layer 12, the gate electrode 22, and the sidewalls 42 and 43. The additional insulating layer 48 may comprise an oxide and/or nitride layer. It will be understood that the additional insulating layer 48 may comprise other materials capable of insulating semiconductor elements.

Figure 1G:
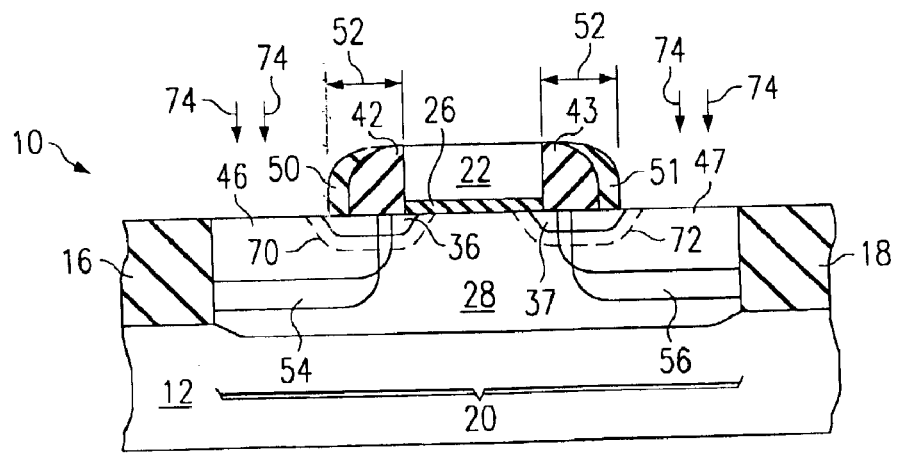

Referring to FIG. 1G, the additional insulating layer 48 may be anisotropically etched to form a first additional sidewall 50 adjacent the first sidewall 42 and a second additional sidewall 51 adjacent the second sidewall 43. The anisotropic etch may be a conventional reactive ion etch (RIE) using processes well known in the art. The additional sidewalls 50 and 51 in this embodiment have a width of approximately 300 to 400 angstroms, making a total width 52 of about 800 angstroms of the initial sidewalls 42 and 43 plus the additional sidewalls 50 and 51, respectively.

Dopants 74 may be implanted into the exposed portions of the active area 20 between the first additional sidewall 50 and isolation member 16 to form a blanket deep source 54 and between the second additional sidewall 51 and isolation member 18 to form a blanket deep drain 56. This deep implant is referred to as a "compensation implant" and is used to lower junction capacitance and diode leakage. The blanket implants 54 and 56 are spaced farther away from the channel than the source and drain main bodies 46 and 47 and do not penalize the short channel effects. In other embodiments, this deep implant could be performed using a photomask. For the embodiment where the transistor shown in FIGS. 1A–1G is an n-MOS transistor, the dopants 74 may comprise phosphorus and may be implanted to a dose of about 1E13 atoms/cm$^2$ to 5E14 atoms/cm$^2$, at an energy of about 25 to 50 keV. For the embodiment where the transistor shown in FIGS. 1A–1G is a p-MOS transistor, the dopants 74 may comprise boron and be implanted to a dose of about 1E13 to 5E14 atoms/cm$^2$, at an energy of about 5 to 20 keV.

For the embodiment where the transistor shown in FIGS. 1A–1G is an n-MOS transistor, any p-MOS transistor elements on the same circuit (e.g., a CMOS circuit) that have been covered during implantation of the dopants 62, may be left uncovered during implantation of the dopants 74 to save a masking step. In such an embodiment, doses of p-type dopants in the p-MOS transistor S/D region elements may be increased to compensate for the blanket n-type implant. Specifically, if the n-type blanket source/drain regions 54 and 56 are doped to a dose of about 1E13 atoms/cm2 to 1E15 atoms/cm2 of phosphorus, shallow p-MOS source and drain bodies implanted in a p-MOS element on the same circuit may be doped to a dose of about 1E15 atoms/cm2 to 3E15 atoms/cm2 of boron, and deep p-MOS source and drain bodies may be implanted at a dose of about 5E13 atoms/cm2 to 2E14 atoms/cm2 of boron.

Similarly, for another embodiment wherein the transistor shown in FIGS. 1A–1G is a p-MOS transistor, any n-MOS transistor elements on the same circuit that have been covered during implantation of the dopants 62, may be left uncovered during implantation of the dopants 74 to save a masking step. In such an embodiment, doses of n-type dopants in the n-MOS transistor S/D region elements may be increased to compensate for the blanket p-type implant. Specifically, if the p-type blanket source/drain regions 54 and 56 comprise boron doped to a dose of about 1E13 to 1E15 atoms/cm$^2$, shallow n-MOS source and drain bodies implanted in an n-MOS element on the same circuit may be doped to a dose of about 1E5 to 3E15 atoms/cm$^2$ of arsenic, and deep n-MOS source and drain bodies may be implanted at a dose of about 5E13 to 5E14 atoms/cm$^2$ of phosphorus.

Figure 2A:
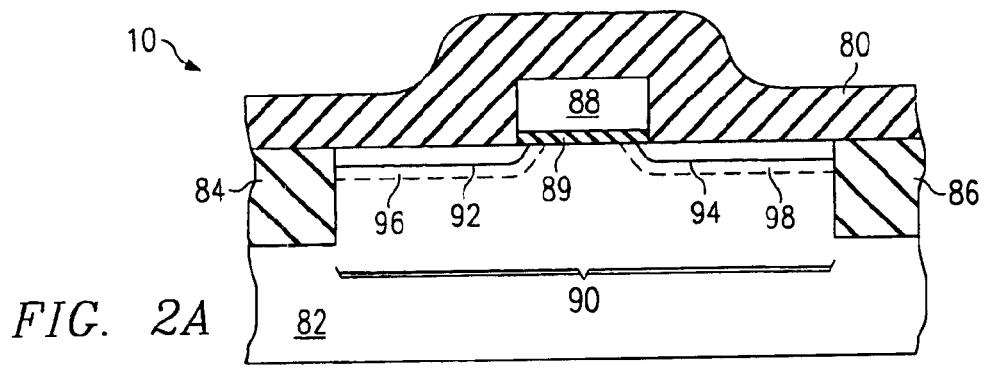
FIGS. 2A–C are a series of schematic cross-sectional diagrams illustrating fabrication of a transistor source/drain regions and blanket compensation implants in accordance with another embodiment of the present invention.
Figure 2B:
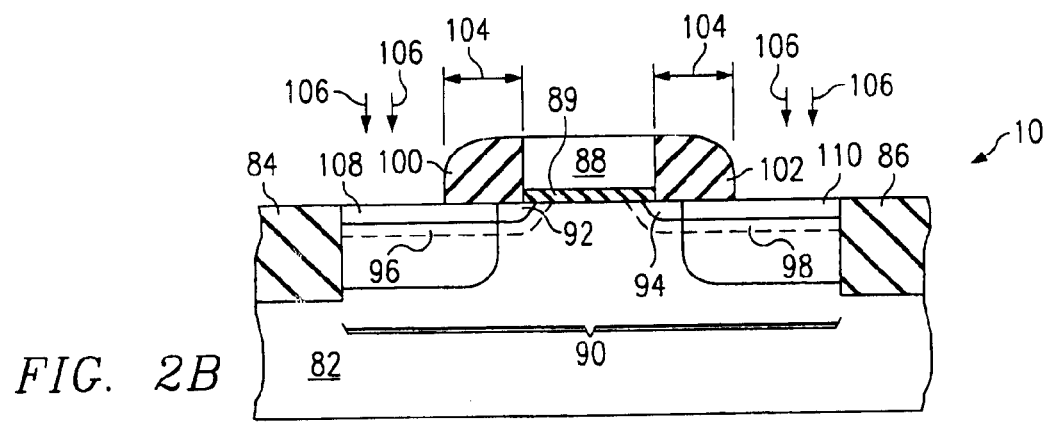
Figure 2C:
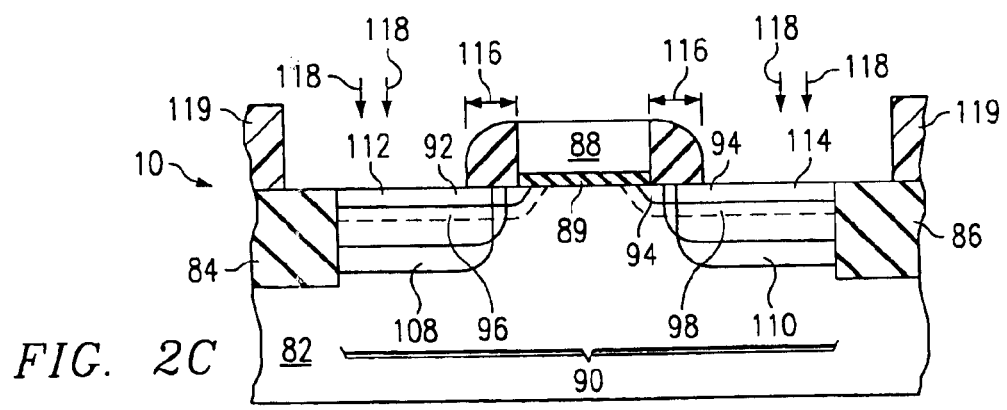

FIGS. 2A–C are a series of schematic cross-sectional diagrams illustrating fabrication of a transistor source/drain regions and blanket compensation implants in accordance with another embodiment of the present invention.

Referring to FIG. 2A, a semiconductor structure 78 comprises the following components formed as described above in reference to the corresponding components shown and described in reference to FIGS. 1A–1D: a semiconductor layer 82, a first isolation member 84, a second isolation member 86, an active area 90, a gate electrode 88, a gate insulator 89, a source extension 92, a drain extension 94, pockets 96 and 98, and an insulating layer 80.

Referring to FIG. 2B, the insulating layer 80 may be anisotropically etched to form a first sidewall 100 and a second sidewall 102. The anisotropic etch may be a conventional reactive ion etch (RIE) using processes well known in the art. The sidewalls 100 and 102 in this embodiment have a width 86 of approximately 500 to 1500 angstroms.

Dopants 106 may be implanted into the exposed portions of the active area 90 between the first sidewall 100 and isolation member 84 to form the blanket deep source 108 and between the second sidewall 102 and isolation member 86 to form the blanket deep drain 110. The blanket deep source 108 and the blanket deep drain 110 would be of a similar kind and dose as described above in reference to the blanket deep source 54 and the blanket deep drain 56 of FIG. 1G.

For the embodiment where the transistor shown in FIGS. 2A–2B is an n-MOS transistor, any p-MOS transistor elements on the same circuit as the n-MOS transistor (e.g., a CMOS circuit) may be uncovered during implantation of the dopants 106. In such an embodiment, doses of p-type dopants in the p-MOS transistor elements may be increased to compensate for the blanket n-type implant. In a particular embodiment, after construction of the elements described in reference to FIGS. 2A and 2B, including implantation of dopants 106 at a dose of about 1E13 atoms/cm2 to 1B15 atoms/cm2 of phosphorus, shallow p-MOS source and drain bodies may be implanted at a dose of about 1E15 atoms/cm2 to 3E15 atoms/cm2 of boron and deep p-MOS source and drain bodies may be implanted at a dose of about 5E13 atoms/cm2 to 2E14 atoms/cm2 of boron.

Likewise, for the embodiment where the transistor shown in FIGS. 2A–2B is a p-MOS transistor, any n-MOS transistor elements on the same circuit as the p-MOS transistor may be uncovered during implantation of the dopants 106. In such an embodiment, doses of n-type dopants in the n-MOS transistor S/D region elements may compensate for the blanket p-type implant. Specifically, if the p-type blanket source/drain regions 108 and 110 are doped to a dose of about 1E13 to 1E15 atoms/cm2 of boron, shallow n-MOS source and drain bodies implanted in an n-MOS element on the same circuit may be doped to a dose of about 1E15 to 3E15 atoms/cm2 of arsenic, and deep n-MQS source and drain bodies may be implanted at a dose of about 5E13 to 5E14 of phosphorus.

In reference to FIG. 2C, the sidewalls 100 and 102 may be anisotropically etched such that they have a reduced width 116 of approximately 200 to 800 angstroms. Dopants 118 may be implanted into the exposed portions of the active area 90 between the reduced-width sidewalls and the isolation members 84 and 86 to form source and drain regions 112 and 114. This dopant implant is made at a high dose to reduce source-drain resistance.

For the embodiment where the transistor shown in FIGS. 2A–2C is an n-MOS transistor, the dopants 118 may comprise n-type dopants such as arsenic. The dopants 118 may be implanted to a dose of about 1-3E15 atoms/cm$^2$, at an energy of about 40–60 keV. If a p-MOS transistor elements are present in the same circuit as the n-MOS transistor, the p-MOS transistor element may be covered during implantation of the dopants 118.

For the embodiment where the transistor shown in FIGS. 2A–2C is a p-MOS transistor, the dopants 118 may comprise p-type dopants such as boron. The dopants 118 may be implanted to a dose of about 1E15 to 3E15 atoms/cm$^2$, at an energy of about 2 to 10 keV. If an n-MOS transistor elements are present in the same circuit as the p-MOS transistor element, the n-MOS transistor element may be covered during implantation of the dopants 118.

Figure 3:
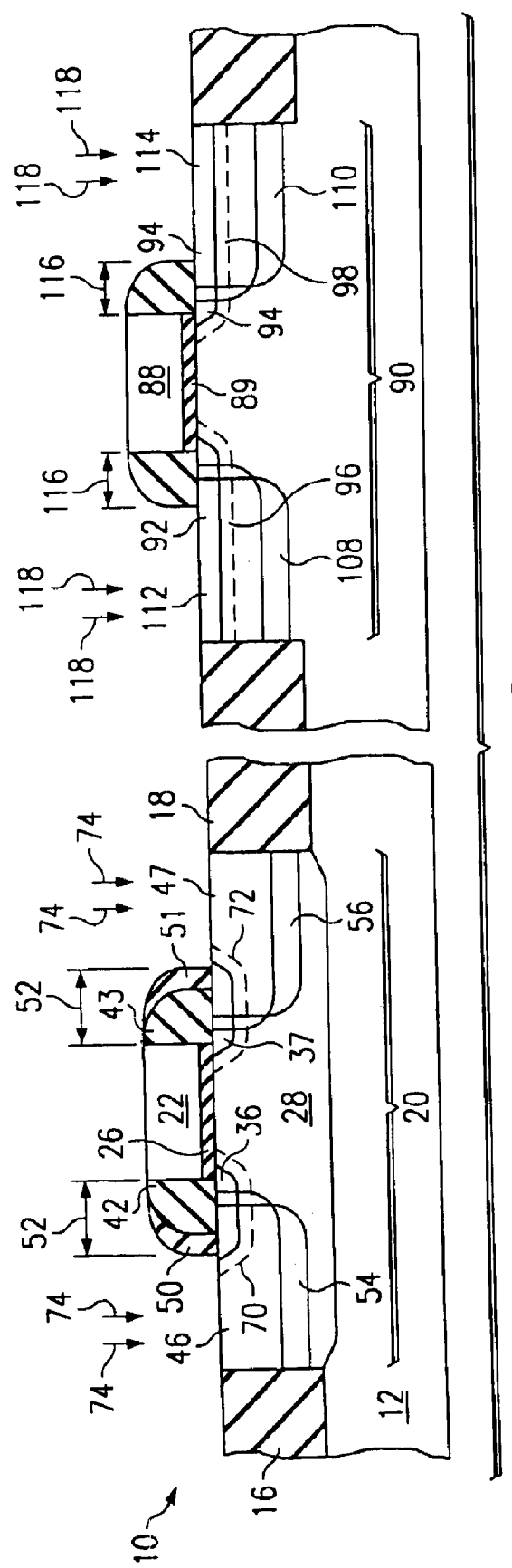
FIG. 3 depicts a CMOS device accordance with one embodiment of this present invention.

FIG. 3 depicts a CMOS device accordance with the embodiment of this present invention in which the nMOS transistor is similar to a nMOS transistor as depicted in FIGS. 1A–1G; and the pMOS transistor is similar to a pMOS transistor as depicted in FIGS. 2A–2C. Like reference numerals in the figures designate similar or corresponding elements, regions, and portions.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A CMOS device, comprising:
a semiconductor substrate having a surface;
an nMOS transistor near the surface of the substrate having a first gate element over the semiconductor substrate, a first channel region near the first gate element, and an n-type source region having a first n-type dopant profile, a second n-type dopant file, and a third n-type dopant profile, the third n-type dopant receding from the first channel region; and
a pMOS transistor near the surface of the substrate having a second gate element over the semiconductor substrate, a second channel region near the second gate element and a p-type source region having the third n-type dopant profile, the third n-type dopant profile receding from the second channel region.

2. The CMOS device of claim 1, wherein the first n-type dopant profile is a source extension ion implant profile, the second n-type dopant profile is a shallow source body ion implant profile, and the third n-type dopant profile is a blanket ion implant profile.

3. The CMOS device of claim 1, wherein the nMOS transistor further comprises a first gate edge nearer the second n-type dopant profile than the third n-type dopant profile.

4. The CMOS device of claim 3, wherein a two-layered sidewall is affixed to the first gate edge.

5. The CMOS device of claim 3, wherein a single-layered sidewall is affixed to the first gate edge.

6. A CMOS device, comprising:
a semiconductor substrate having a surface;
a pMOS transistor near the surface of the substrate having a first gate element over the semiconductor substrate, a first channel region near the first gate element, and a p-type source region having a first p-type dopant profile, a second p-type dopant file, and a third p-type dopant profile, the third p-type dopant receding from the first channel region; and
an nMOS transistor near the surface of the substrate having a second gate element over the semiconductor substrate, a second channel region near the second gate element and an n-type source region having the third p-type dopant profile, the third p-type dopant profile receding from the second channel region.

7. The CMOS device of claim 6, wherein the first p-type dopant profile is a source extension ion implant profile, the second p-type dopant profile is a shallow source body ion implant profile, and the third p-type dopant profile is a blanket ion implant profile.

8. The CMOS device of claim 6, wherein the pMOS transistor further comprises a first gate edge nearer the second p-type dopant profile than the third p-type dopant profile.

9. The CMOS device of claim 8, wherein a two-layered sidewall is affixed to the first gate edge.

10. The CMOS device of claim 8, wherein a single-layered sidewall is affixed to the first gate edge.

* * * * *